United States Patent
Schaffer et al.

(10) Patent No.: US 12,125,841 B2
(45) Date of Patent: Oct. 22, 2024

(54) PROTECTION DEVICE WITH P-N JUNCTION DEVICES MONOLITHICALLY INTEGRATED IN A SEMICONDUCTOR BODY

(71) Applicant: Infineon Technologies AG, Neubiberg (DE)

(72) Inventors: Josef-Paul Schaffer, Bruckmuehl (DE); Hubert Werthmann, Munich (DE); Juliane Laurer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 118 days.

(21) Appl. No.: 17/877,001

(22) Filed: Jul. 29, 2022

(65) Prior Publication Data

US 2024/0038756 A1 Feb. 1, 2024

(51) Int. Cl.
*H01L 27/02* (2006.01)

(52) U.S. Cl.
CPC .................. *H01L 27/0248* (2013.01)

(58) Field of Classification Search
CPC ......... H01L 23/60; H01L 28/20; H01L 28/10; H01L 27/0248; H01L 29/866; H02H 9/044; H02H 9/04; H03K 5/08
USPC ............................................ 361/56, 117–120
See application file for complete search history.

(56) References Cited

U.S. PATENT DOCUMENTS

| | | | | |
|---|---|---|---|---|
| 9,159,719 B2* | 10/2015 | Mayerhofer | ........ | H01L 27/0255 |
| 2008/0310065 A1* | 12/2008 | Ho | ........ | H01L 27/0676 |
| | | | | 361/91.5 |
| 2010/0060349 A1* | 3/2010 | Etter | .......... | H01L 27/0255 |
| | | | | 257/E21.608 |
| 2013/0099353 A1* | 4/2013 | Kato | ............ | H01L 27/0296 |
| | | | | 257/659 |
| 2014/0211348 A1* | 7/2014 | Wang | ............ | H03H 7/0138 |
| | | | | 361/56 |
| 2017/0019083 A1* | 1/2017 | Fukae | ............ | H03H 1/02 |

OTHER PUBLICATIONS

Tylaite, Egle, et al., "ESD Protection Device With Isolation Structure Layout That Minimizes Harmonic Distortion", U.S. Appl. No. 17/536,253, filed Nov. 29, 2021, 1-32.
Tylaite, Egle, et al., "Unidirectional ESD Protection with Lateral and Vertical Device", U.S. Appl. No. 63/243,503, filed Sep. 13, 2021, 1-24.

* cited by examiner

*Primary Examiner* — Danny Nguyen
(74) *Attorney, Agent, or Firm* — Murphy, Bilak & Homiller, PLLC

(57) ABSTRACT

A semiconductor device includes a semiconductor body including an upper surface, input and output terminals disposed on the upper surface of the semiconductor body, first and second p-n junction devices that are monolithically integrated in the semiconductor body, and a signal line protection circuit connected between the input and output terminals and comprising a low-pass filter and a voltage clamping device, wherein each of the low-pass filter and the voltage clamping device include the first and second p-n junction devices.

5 Claims, 3 Drawing Sheets

PROTECTION DEVICE WITH P-N JUNCTION DEVICES MONOLITHICALLY INTEGRATED IN A SEMICONDUCTOR BODY

TECHNICAL FIELD

The instant application relates to electronic circuit protection devices, and more particularly relates to devices that protect electronic circuits from electrostatic discharge and/or electromagnetic interference events.

BACKGROUND

Components such as transistors, diodes, resistors, electro-optical devices, precision film resistors and a variety of integrated circuits are susceptible to damage at every stage of production and during operation. Electrostatic discharge (ESD) is one phenomenon that can cause irreparable damage and/or malfunction of electrical components. Electrostatic discharge occurs when there is a buildup of static charges that rapidly discharge whereby a component is subjected to a large electrical current. Electromagnetic interference (EMI) is another phenomenon that can cause irreparable damage and/or malfunction of electrical components. EMI occurs when there is a source of radiation that creates unwanted noise on a signal line. The source of radiation can be from the external environment or from other signal lines or devices within the same component. As electronics manufacturers drive to miniaturize devices and improve operating speeds, vulnerability of the devices to ESD and EMI is increasing. Moreover, current solutions for preventing or mitigating unwanted effects of ESD and EMI can be costly and/or negatively impact device size.

SUMMARY

A semiconductor device is disclosed. According to an embodiment, the semiconductor device comprises a semiconductor body comprising an upper surface, input and output terminals disposed on the upper surface of the semiconductor body, first and second p-n junction devices that are monolithically integrated in the semiconductor body, and a signal line protection circuit connected between the input and output terminals and comprising a low-pass filter and a voltage clamping device, wherein each of the low-pass filter and the voltage clamping device comprise the first and second p-n junction devices.

According to another embodiment, the semiconductor device comprises a semiconductor body comprising an upper surface, an input pad, an output pad, and a reference potential pad, each being disposed on the upper surface, a first diode region comprising a first p-n junction device that is connected in series between the input pad and the reference potential pad, a second diode region that is laterally spaced apart from the first diode region and comprises a second p-n junction device that is connected in series between the output pad and the reference potential pad, and a resistor region that is laterally between the first diode region and the second diode region and comprises a resistor that is connected in series between the input pad and the output pad.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B, illustrate schematic equivalent circuits of the semiconductor device comprising the first and second p-n junction devices monolithically integrated in the semiconductor body, according to an embodiment. FIG. 2A illustrates a schematic equivalent of a voltage clamping device with diodes formed by the first and second p-n junction devices; and FIG. 2B illustrates a schematic equivalent of a low-pass filter with capacitances provided by the first and second p-n junction devices.

DETAILED DESCRIPTION

Embodiments of a semiconductor device that is advantageously configured to provide both ESD protection and EMI protection to a signal line are described herein. The semiconductor device provides ESD protection with a voltage clamping device that uses reverse biased diodes to define a clamping voltage. The semiconductor device provides EMI protection with a low-pass filter that uses capacitances to shunt high frequency noise signals to a reference potential such as ground potential. Advantageously, the voltage clamping device and the low-pass filter each utilize first and second p-n junction devices that are monolithically integrated in the semiconductor body. That is, the same p-n junction devices that are used for voltage clamping in the voltage clamping device are used as capacitances for frequency filtering. This provides a solution for ESD protection and EMI protection in a device that is easy to manufacture and has minimal area consumption. Moreover, a device layout disclosed herein allows for a large and easily tuned capacitance of the low-pass filter that mitigates higher order harmonic effects.

Figure 1:
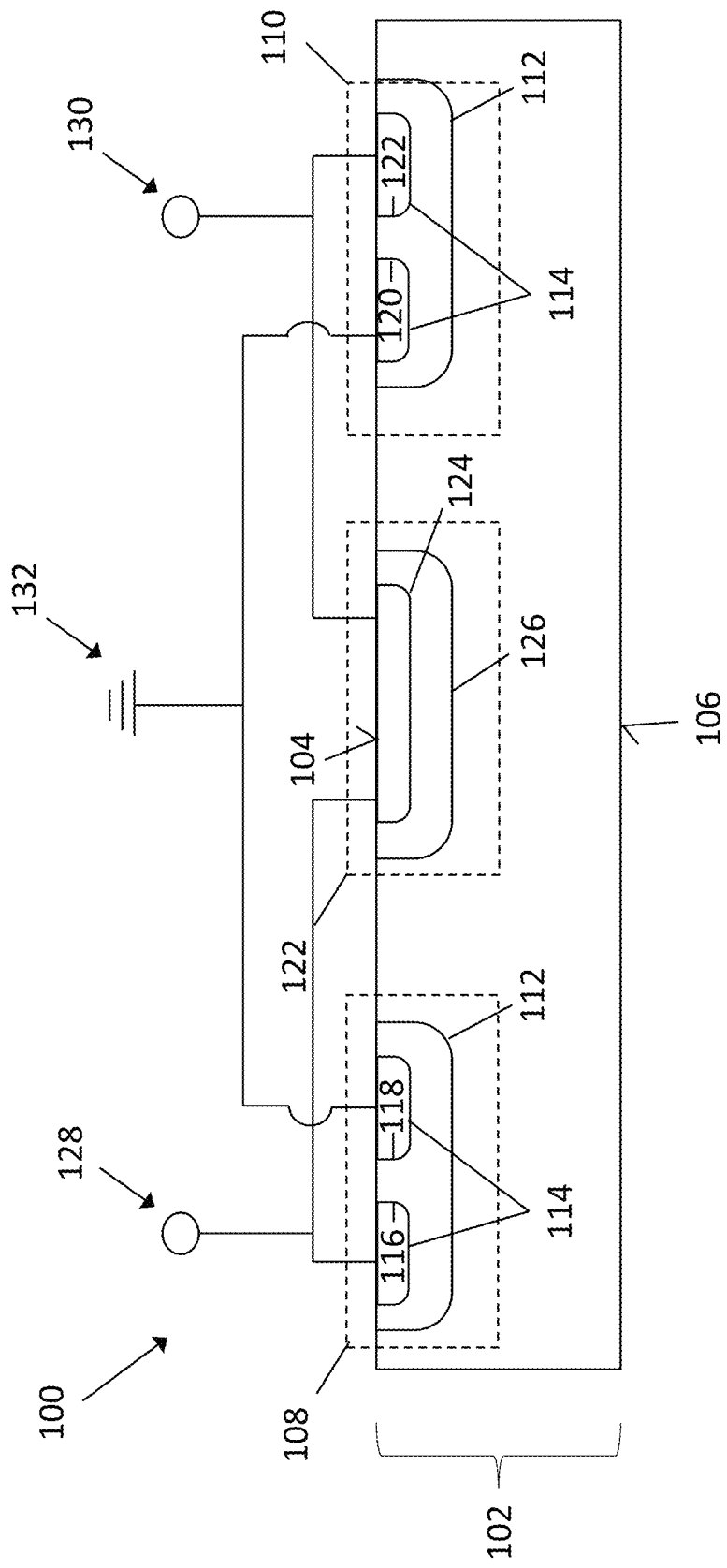
FIG. 1 illustrates a semiconductor device that comprises first and second p-n junction devices that are monolithically integrated in a semiconductor body, according to an embodiment.

Referring to FIG. 1, a semiconductor device 100 is formed in a semiconductor body 102. The semiconductor body 102 comprises an upper surface 104 and a rear surface 106 opposite the upper surface 104. The semiconductor body 102 can be any semiconductor substrate that can be used to form active electronic components therein. The semiconductor body 102 may comprise semiconductor material from group IV elemental semiconductors, IV-IV compound semiconductor material, Ill-V compound semiconductor material. Examples of the semiconductor materials from the group IV elemental semiconductors include, inter alia, silicon (Si) and germanium (Ge). Examples of the IV-IV compound semiconductor materials include, inter alia, silicon carbide (SiC) and silicon germanium (SiGe). Examples of the III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). The semiconductor body 102 may have an intrinsic dopant concentration, i.e., a background concentration of the semiconductor material before any active regions are formed by doping processes. This intrinsic dopant concentration may be a net n-type or net p-type dopant concentration which may be no greater than $10^{17}$ dopant atoms/cm$^3$ and more typically in the range of $10^{12}$ dopant atoms/cm$^3$ to $10^{15}$ dopant atoms/cm$^3$.

The semiconductor device 100 comprises first and second p-n junction devices 108, 110 that are monolithically integrated in the semiconductor body 102. In the depicted embodiment, the first p-n junction device 108 is formed by a first conductivity type region 112 that extends from the upper surface 104 of the semiconductor body 102 and a pair of second conductivity type regions 114 that are formed within the first conductivity type region 112 and spaced apart from one another. The first conductivity type region 112 may be a p-type region and the second conductivity type regions 114 may be n-type regions, or vice versa. The first p-n junction device 108 is thus arranged as an N-P-N structure or a P-N-P structure comprising first and second p-n junctions 116, 118 that form lateral p-n junction diodes at the upper surface 104 of the semiconductor body 102. Correspondingly, the second p-n junction device 110 is formed by a first conductivity type region 112 that extends from the upper surface 104 of the semiconductor body 102 and a pair of second conductivity type regions 114 that are formed within the first conductivity type region 112 and spaced apart from one another. The second p-n junction device 110 is thus arranged as an N-P-N structure or a P-N-P structure comprising third and fourth p-n junctions 120, 122 that form lateral p-n junction diodes at the upper surface 104 of the semiconductor body 102.

The first conductivity type regions 112 and the second conductivity type regions 114 which form the first and second p-n junction devices 108, 110 may be doped wells that are formed by implanting dopant atoms into the upper surface 104 of the semiconductor body 102 and subsequently annealing the semiconductor body 102 to activate the implanted dopant atoms. The first conductivity type regions 112 may have a net dopant concentration of between $10^{17}$ dopant atoms/cm$^3$ to $10^{20}$ dopant atoms/cm$^3$, for example. The second conductivity type regions 114 may have a net dopant concentration that is higher than that of the first conductivity type regions 112 and may be between $10^{18}$ dopant atoms/cm$^3$ to $10^{22}$ dopant atoms/cm$^3$, for example.

The semiconductor device 100 comprises a resistor 122 that is monolithically integrated in the semiconductor body 102. The resistor 122 is a passive electrical element that is configured to provide a defined electrical resistance between two terminals in a commonly known manner. According to an embodiment, the resistor 122 is configured as a so-called diffusion resistance that comprises a diffusion doped well 124 that defines the electrical resistance along a span in the semiconductor body 102. The diffusion doped well 124 can have a net dopant concentration of between $10^{18}$ dopant atoms/cm$^3$ to $10^{22}$ dopant atoms/cm$^3$, for example. The diffusion doped well 124 can have either of the first or second conductivity types and can be formed by the same process which forms the second conductivity type regions 114 of the first and second p-n junction devices 108, 110. The diffusion doped well 124 may be electrically isolated from the surrounding substrate region of the semiconductor body 102. As shown, this electrical isolation is provided by a second well 126 that surrounds the diffusion doped well 124. The second well 126 has an opposite conductivity type as the diffusion doped well 124 and can be formed by the same process which forms first conductivity type regions 112 of the first and second p-n junction devices 108, 110. Separately or in combination, the diffusion doped well 124 may be electrically isolated from the surrounding substrate region of the semiconductor body 102 by other electrical isolation structures such as trenches and/or regions of dielectric material, e.g., SiO$_2$ (silicon dioxide), SiN (silicon nitride), SiO$_x$N$_y$ (silicon oxynitride), etc. Separately or in combination, the resistor 122 can be at least partially provided by other elements that are formed on or within the semiconductor body 102. For example, the resistor 122 can comprise a resistance element formed in an interconnect layer comprising, e.g., polysilicon, tungsten, etc., that is formed on the upper surface 104 of the semiconductor body 102.

The semiconductor device 100 comprises an input terminal 128, an output terminal 130, and a reference potential terminal 132, each of which are schematically represented in FIG. 1. The input terminal 128, the output terminal 130, and the reference potential terminal 132 are electrically connected to the active regions of the semiconductor device 100 by low-ohmic connections. The reference potential terminal 130 is connected to a reference potential such as a ground potential. Each of the input terminal 128, the output terminal 130, and the reference potential terminal 132 are disposed on the upper surface 104 of the semiconductor body 102, meaning that these terminals are formed in conductive structures that either directly contact the upper surface 104 or are disposed over the upper surface 104 with an intermediary region such as a dielectric region disposed between. As will be evidenced by the embodiment of FIG. 3, the input terminal 128, the output terminal 130, and the reference potential terminal 132 can correspond to pad structures in an uppermost metallization of the semiconductor device 100. Alternatively, the input terminal 128, the output terminal 130, and the reference potential terminal 132 can correspond to internal terminals within the wiring region of an integrated component.

The first p-n junction device 108 is connected in series between the input terminal 128 and the reference potential terminal 132, the second p-n junction device is connected in series between the output terminal 130 and the reference potential terminal 132, and the resistor 122 is connected in series between the input and output terminals 128, 130. Each of these electrical connections may be effectuated by an interconnect region that is formed on the upper surface 104 of the semiconductor body 102, i.e., a so-called back-end-of the line region, an example of which will be described in further detail below with reference to FIG. 3.

Figure 2:
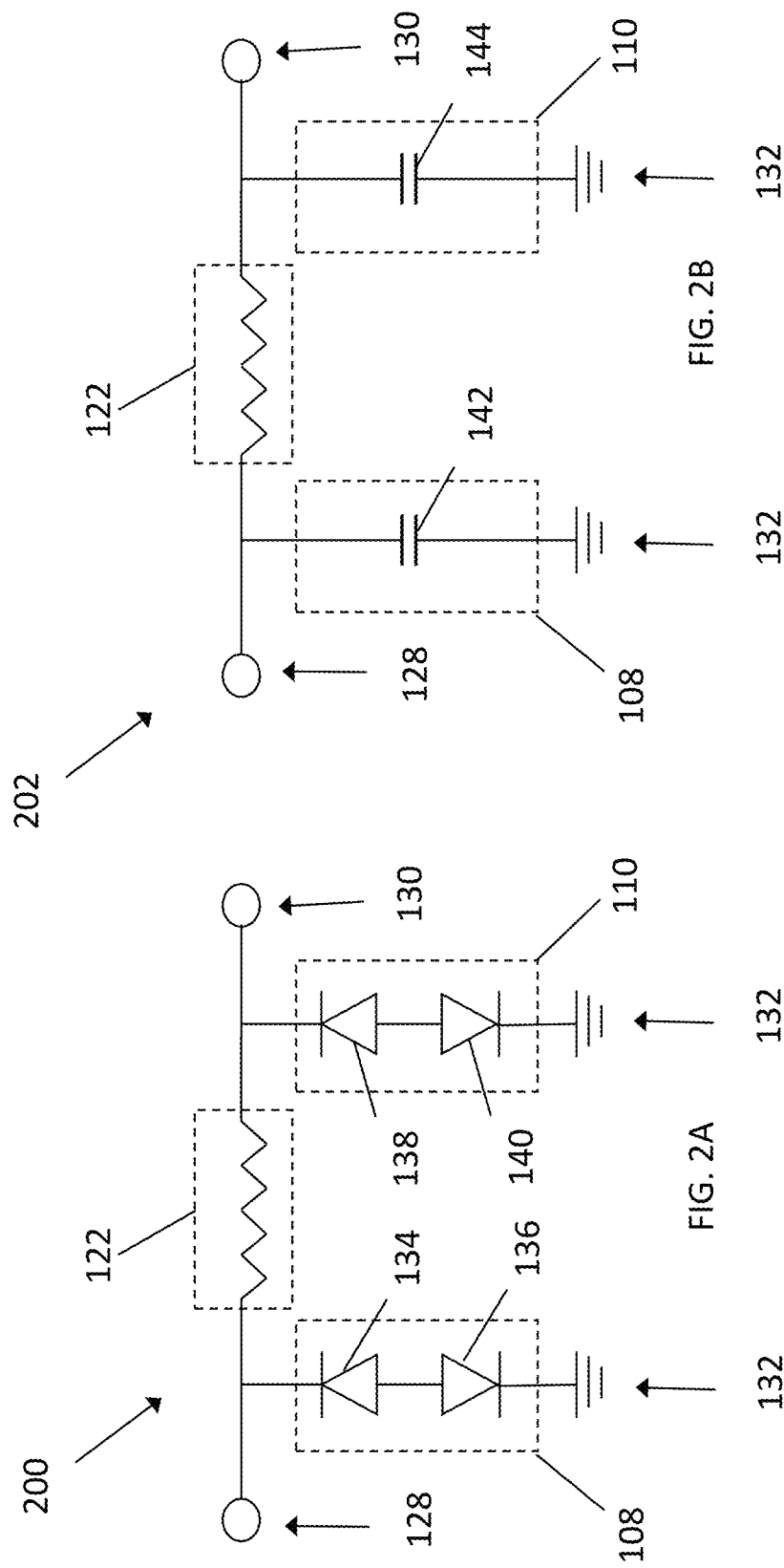
FIG. 2, which includes

Referring to FIG. 2, equivalent schematic representations of semiconductor device 100 are shown. FIG. 2A illustrates a voltage clamping device 200 that is connected between the input terminal 128, the output terminal 130, and the reference potential terminal 132. The voltage clamping device 200 is configured to maintain the voltage of a signal line that is connected in series with the input and output terminals 128, 130 at or below a safe voltage level, i.e., a clamping voltage, relative to the reference potential. FIG. 2B illustrates a low-pass filter 202 that is connected between the input terminal 128, the output terminal 130, and the reference potential terminal 132. The low-pass filter 202 that is configured to transmit low frequency and DC signals on a signal line that is connected in series with the input and output terminals 128, 130 and remove signals with a frequency higher than a predefined cutoff value from the signal line.

Referring to FIG. 2A, the voltage clamping device 200 comprises the first p-n junction device 108 and the second p-n junction device 110. The first p-n junction device 108 comprises first and second p-n junction diodes 134, 136 that are arranged in an antiseries configuration such that the first p-n junction diode 134 is forward biased when the second p-n junction diode 136 is reverse biased, and vice-versa. The antiseries connected first and second p-n junction diodes 134, 136 result from the first and second p-n junctions 116, 118 of the first p-n junction device 108 as described with reference to FIG. 1. The second p-n junction device 110 comprises third and fourth p-n junction diodes 138, 140 that are arranged in an antiseries configuration such that the third p-n junction diode 138 is forward biased when the fourth p-n junction diode 138 is reverse biased, and vice-versa. The antiseries connected third and fourth p-n junction diodes 138, 140 result from the third and fourth p-n junctions 120, 122 of the second p-n junction device 120 as described with reference to FIG. 1.

The working principle of the voltage clamping device 200 is as follows. The first and second p-n junction diodes 134, 136 form a first current shut that becomes conductive once a positive voltage drop as between the signal line and the reference potential exceeds a reverse conduction voltage of the first p-n junction diode 134 and a forward conduction voltage of the second p-n junction diode 136. A similar clamping occurs with a negative drop as between the signal line and the reference potential, except that the conduction state of the first and second p-n junction diodes 134, 136 is reversed. Likewise, the third and fourth p-n junction diodes 138, 140 form a second current shut that becomes conductive once a positive voltage drop as between the signal line and the reference potential exceeds a reverse conduction voltage of the third p-n junction diode 138 and a forward conduction voltage of the fourth p-n junction diode 140. A similar clamping occurs with a negative drop as between the signal line and the reference potential, except that the conduction state of the third and fourth p-n junction diodes 138, 140 is reversed. Thus, the first and second p-n junction devices 108, 110 each form an independent branch of the voltage clamping device 200 wherein a clamping voltage of this branch corresponds to the reverse conduction voltage of one diode plus the forward conduction voltage another. The resistor 122 creates a voltage drop on the signal line such that a large current applied to the input terminal 128 is mainly shunted by the first and second p-n junction diodes 134, 136 and such that a large current applied to the output terminal 130 is mainly shunted by the third and fourth p-n junction diodes 138, 140, assuming equal parameters for each current shunt.

Referring to FIG. 2B, the low-pass filter 202 is configured as an RC circuit that is connected between the input and output terminals 128, 130 and the reference potential terminal 132. The resistance of the RC circuit is substantially provided by the resistor 122. The capacitance of the RC circuit is substantially provided by the first and second p-n junction devices 108, 110, wherein the equivalent capacitance of the first and second p-n junction devices 108, 110 is schematically represented as first and second capacitors 142, 144 in the figure. As is known by those of ordinary skill, a p-n junction has a charge storing capability that is mainly attributable to two different charge storing phenomena, namely so-called transition capacitance and so-called diffusion capacitance. P-n junction diodes can be equated to capacitors, wherein the capacitance value is determined by doping concentrations, junction area given and bias point. The voltage dependency of the capacitance can be accounted for and minimized for the EMI filtering ranges.

The first capacitor 142 and the second capacitor 144 as shown in FIG. 2A are equivalent capacitances that represent the overall capacitance contribution of the first p-n junction device 108 and the second p-n junction device 110, respectively at a given bias point. As previously explained, the first p-n junction device 108 and the second p-n junction device 110 may each comprise a pair of p-n junction diodes connected in an antiseries configuration. Thus, the first capacitor 142 may represent the equivalent capacitance contribution of the first and second p-n junction diodes 134, 136 when solving for two capacitors connected in series for one another, and the second capacitor 144 may represent the equivalent capacitance contribution of the third and fourth p-n junction diodes 138, 140 when solving for two capacitors connected in series for one another. Moreover, because these capacitors are voltage dependent, the absolute capacitance value of the first and second capacitor 142, 144 will vary depending on bias conditions.

The working principle of the low-pass filter 202 is as follows. The input and output terminals 128, 130 can be connected to a signal line with the resistor 122 being in series with the connection line. At low frequencies, the first and second capacitors 142, 144 present a high impedance thus a DC signal or low frequency signal is transmitted across the connection line. At high frequencies, the first and second capacitors 142, 144 present a low impedance thus the signal is effectively short circuited to the reference potential terminal 132. The cutoff frequency of the low-pass filter 202 is defined by the RC constant of the circuit, which is determined by the resistance of the resistor 122 and the capacitance of the first and second capacitors 142, 144.

The voltage clamping device 200 and the low-pass filter 202 thus form a signal line protection circuit of the semiconductor device 100 whereby the voltage clamping device 200 can provide ESD protection and the low-pass filter 202 can provide EMI protection. The low-pass filter 202 and the voltage clamping device 200 each include the first and second p-n junction devices 108, 110 as part of these circuits. Advantageously, by making dual usage of the p-n junction structures as both transient voltage suppression diodes for ESD protection and capacitor structures for RC filtering, the device offers lower component count, smaller area, lower manufacturing complexity and/or cost in comparison to a solution that uses separate components for each function.

The semiconductor device 100 can have performance parameters that are desirable or at least acceptable for many applications. For example, an insertion loss of the low-pass filter 202 can be at least 20 dBm at 600 MHz. Separately or in combination, a clamping voltage of the voltage clamping device 200 can be no more than 10 volts at 16 amperes. The parameters of the semiconductor device 100 can be realized by tailoring the geometric properties of the p-n junctions which form the first and second p-n junction devices 108, 110. These geometric properties of the p-n junctions include the dopant concentrations of the first conductivity type regions 112 and the second conductivity type regions 114 and the area of the p-n junctions which form the first and second p-n junction devices 108, 110.

Figure 3:
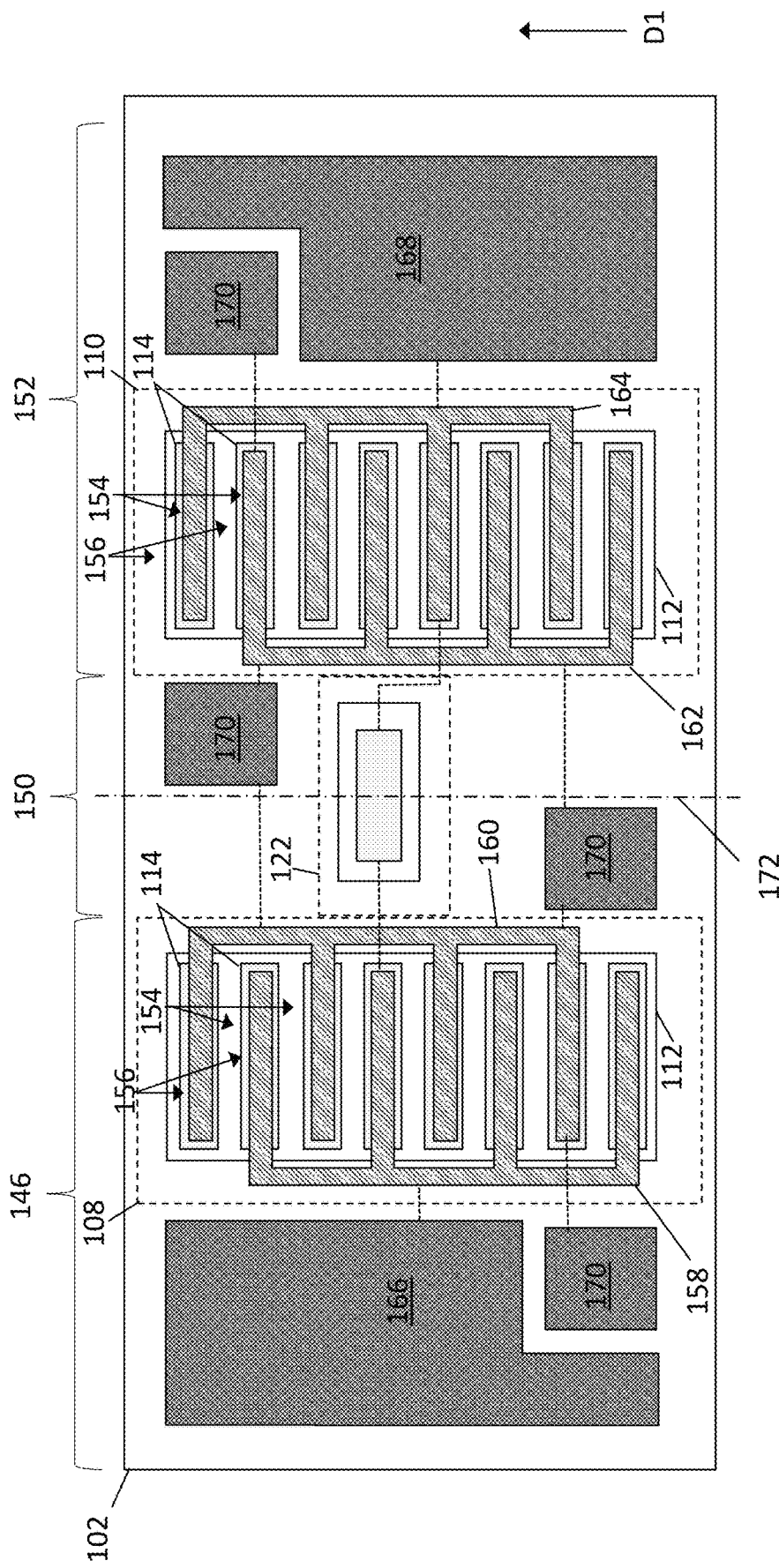
FIG. 3 illustrates a plan-view layout of the semiconductor device that comprises first and second p-n junction devices that are monolithically integrated in a semiconductor body, according to an embodiment.

Referring to FIG. 3, an exemplary layout of the semiconductor device 100 is shown. The semiconductor device 100 comprises a first diode region 146 that comprises the first p-n junction device 108, a second diode region 148 that is laterally spaced apart from the first diode region 146 and comprises the second p-n junction device 110 and a resistor region 150 that is laterally between the first diode region 146 and the second diode region 148 and comprises the comprises the resistor 122. That is, the layout is such that the resistor 122 is centrally located in between the first and second p-n junction devices 108, 110.

The first and second diode regions 146, 148 each comprise a plurality of elongated first conductivity type regions 154 and a plurality of elongated second conductivity type regions 156. In this context, the term elongated refers to the fact that these regions comprise longer sides and shorter sides. The elongated first conductivity type regions 154 are interdigitated with the elongated second conductivity type regions 156, meaning that the elongated first conductivity type regions 154 and the elongated second conductivity type regions 156 alternate with one another along a first direction D1. As shown, the interdigitated configuration is realized by an array of rectangular shaped second conductivity type regions 114 that are regularly spaced apart from one another in the first direction D1. These second conductivity type regions 114 are arranged within a larger first conductivity type region 112. This arrangement produces the N-P-N structure or P-N-P structure described with reference to FIG. 1, wherein two immediately adjacent ones of the second conductivity type regions 114 correspond to the pair second conductivity type regions 114 shown in FIG. 1. In other embodiments, an antiseries p-n junction device can be realized by distinct first conductivity type regions arranged within a larger second conductivity type region, or by groups of distinct first conductivity type regions interdigitated between groups of distinct second conductivity type regions.

The semiconductor device comprises conductive runners that electrically contact the elongated second conductivity type regions 156. The conductive runners are formed in a lower interconnect layer of the semiconductor device 100, e.g., a layer comprising tungsten or polysilicon that allows for low-ohmic contact to the doped regions in the semiconductor body 102. The conductive runners comprise a first common connector 158 that electrically connects with a first subgroup of the elongated second conductivity type regions 156 from the first diode region 146 and a second common connector 160 that electrically connects with a second subgroup of the elongated second conductivity type regions 156 from the first diode region 146. This creates a plurality of the NPN structures or PNP structures connected in parallel with one another. Correspondingly, the conductive runners comprise a third common connector 162 that electrically connects with a first subgroup of the elongated second conductivity type regions 156 from the second diode region 148 and a fourth common connector 164 that electrically connects with a second subgroup of the elongated first conductivity type regions 164 from the second diode region 148.

The semiconductor device 100 comprises an input pad 166, output pad 168, and a plurality of reference potential pads 170. The input pad 166 forms the input terminal 128, the output pad 168 forms the output terminal 130, and the reference potential pads 170 form the reference potential terminal 132 in the device described with reference to FIG. 1. Each of the input pad 166, the output pad 168, and the reference potential pads 170 can be formed in an upper-level metallization of the semiconductor device 100 and can be externally accessible for electrical contact thereto. The upper-level metallization may comprise an electrically conductive metal, e.g., copper, aluminum, etc, and may be separated from the upper surface 104 of the semiconductor body 102 and/or from the lower interconnect layer one or more dielectric layers (not shown) comprising, e.g., SiO2 (silicon dioxide), SiN (silicon nitride), SiOxNy (silicon oxynitride), etc. Vertical connection between the various layers is provided by through-via structures (not shown) comprising, e.g., tungsten, nickel, copper, etc., that extend through the dielectric layers.

The electrical connectivity of the signal line protection circuit is realized by the following electrical connections. The input pad 166 and a first end of the resistor 122 are electrically connected to the first subgroup of the elongated first conductivity type regions 154 from the first diode region 146. The output pad 168 and a second end of the resistor 122 are electrically connected to the first subgroup of the elongated first conductivity type regions 154 from the second diode region 148. The reference potential pads 170 are electrically connected to the second subgroups of the elongated first conductivity type regions 154 from the first and second diode regions 146, 148. In the figure, each of these electrical connections are schematically represented by dashed lines. In practice, these electrical connections can be realized any available wiring layers of the semiconductor device 100 in combination with through-via structures.

The disclosed layout allows for a symmetrical or near symmetrical arrangement of the circuit elements which form the signal line protection circuit. This minimizes higher order harmonic effects, including second order harmonic effects. FIG. 3 depicts an axis of symmetry 172 that is laterally between the first and second diode regions 146, 148. According to an embodiment, the elongated first conductivity type regions 154 and the elongated second conductivity type regions 156 of the first diode region 146 are symmetrically arranged with the second conductivity type regions 114 and the elongated second conductivity type regions 156 of the first diode region 146 about the axis of symmetry 172. That is, the doped regions which form the first and second p-n junction devices 108, 110 are arranged symmetrically with respect to the axis of symmetry 172. The interconnect structures formed thereon may also be symmetric or close to symmetric about the axis of symmetry for improved harmonic performance.

The disclosed layout allows for precise tuning of the characteristics of the device first and second p-n junction devices 108, 110. Advantageously, p-n junction area of the first and second p-n junction devices 108, 110 can be finely tuned through simple layout changes, e.g., changing the size and or spacing of n-type wells.

Although the present disclosure is not so limited, the following numbered examples demonstrate one or more aspects of the disclosure.

Example 1. A semiconductor device, comprising a semiconductor body comprising an upper surface, an input terminal, an output terminal, and a reference potential terminal, each being disposed on the upper surface of the semiconductor body, first and second p-n junction devices that are monolithically integrated in the semiconductor body; and a signal line protection circuit connected between the input and output terminals and comprising a low-pass filter and a voltage clamping device, wherein each of the low-pass filter and the voltage clamping device comprise the first and second p-n junction devices.

Example 2. The semiconductor device of example 1, wherein the signal line protection circuit further comprises a resistor that is monolithically integrated in the semiconductor body and is connected in series between the input and output terminals.

Example 3. The semiconductor device of example 2, wherein the first p-n junction device is connected in series between the input terminal and the reference potential terminal, wherein the second p-n junction device is connected in series between the output terminal and the reference potential terminal.

Example 4. The semiconductor device of example 3, wherein the first p-n junction device comprises first and second p-n junction diodes that are arranged in an antiseries configuration, and wherein the second p-n junction device comprises third and fourth p-n junction diodes that are arranged in an antiseries configuration.

Example 5. The semiconductor device of example 2, wherein the low-pass filter is arranged as an RC circuit, wherein a resistance of the RC circuit is substantially provided by the resistor, and wherein a capacitance of the RC circuit is substantially provided by the first and second p-n junction devices.

Example 6. The semiconductor device of example 5, wherein the voltage clamping device comprises first and second current shunts, wherein the first and second p-n junction devices form the first current shunt, and wherein second p-n junction device forms the second current shunt.

Example 7. The semiconductor device of example 1, wherein the semiconductor body comprises a plurality of elongated n-type regions and a plurality p-type regions, and wherein the elongated n-type regions are interdigitated with the p-type regions.

Example 8. The semiconductor device of example 1, wherein an insertion loss of the low-pass filter is at least 20 dBm at 600 MHz.

Example 9. The semiconductor device of example 1, wherein a clamping voltage of the voltage clamping device is no more than 10 V.

Example 10. A semiconductor device, comprising a semiconductor body comprising an upper surface, an input pad, an output pad, and a reference potential pad, each being disposed on the upper surface, a first diode region comprising a first p-n junction device that is connected in series between the input pad and the reference potential pad, a second diode region that is laterally spaced apart from the first diode region and comprises a second p-n junction device that is connected in series between the output pad and the reference potential pad, and a resistor region that is laterally between the first diode region and the second diode region and comprises a resistor that is connected in series between the input pad and the output pad.

Example 11. The semiconductor device of example 10, wherein the first p-n junction device comprises first and second p-n junction diodes that are arranged in an antiseries configuration, wherein the second p-n junction device comprises third and fourth p-n junction diodes that are arranged in an antiseries configuration.

Example 12. The semiconductor device of example 11, wherein the first and second diode regions each comprise a plurality of elongated n-type regions and a plurality of elongated p-type regions, and wherein the elongated n-type regions are interdigitated with the p-type regions.

Example 13. The semiconductor device of example 12, wherein the first and second p-n junction diodes are formed by groups of NPN structures or PNP structures from the first diode region that are connected in parallel with one another, and wherein the third and fourth p-n junction diodes are formed by groups of NPN structures or PNP structures from the second diode region that are connected in parallel with one another.

Example 14. The semiconductor device of example 13, wherein the resistor region comprises a doped diffusion well that extends to the upper surface and is electrically isolated from a surrounding substrate region of the semiconductor body.

Example 15. The semiconductor device of example 13, wherein the groups of NPN structures or PNP structures from the first diode region and the groups of NPN structures or PNP structures from the second diode region are electrically contacted by conductive runners formed in a lower interconnect layer of the semiconductor device.

Example 16. The semiconductor device of example 10, wherein the input pad, the output pad, and the reference potential pad are formed in an upper metallization layer of the semiconductor device, wherein the upper metallization layer is separated from the upper surface of the semiconductor body by one or more dielectric layers.

Example 17. The semiconductor device of example 10, wherein elongated n-type regions and the elongated p-type regions of the first diode region are symmetrically arranged with the n-type regions and the elongated p-type regions of the first diode region about an axis of symmetry that is laterally between the first and second diode regions.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the term "p-n junction device" refers to a device formed by p-type and second conductivity type regions that are formed by actively doping a semiconductor body. A p-n junction device may include one p-n junction or more than one p-n junctions in parallel or in series with one another.

As used herein, the term "substantially provided" when referring to a resistance or capacitance value accounts for the fact that parasitic resistance and capacitance exist in any real device, e.g., resulting from interconnect elements. The resistance and capacitance values of the RC circuit may be selected to account for these parasitic resistance and capacitances, as the case may be.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

The instant specification refers to a "first" conductivity type and a "second" conductivity type of doping regions within a semiconductor body. These terms refer to the majority carrier type of doped semiconductor regions. The present specification also refers to n-type semiconductor regions, i.e., semiconductor regions with a net n-type majority carrier concentration, and p-type semiconductor regions, i.e., semiconductor regions with a net p-type majority carrier concentration. In any of the embodiments described herein, the conductivity types may be reversed to obtain a device that operates on a similar working principle. For example, an n-type device may be converted to a p-type device by changing the second conductivity type regions 114 to first conductivity type regions 112, and vice-versa. The polarity of any diode structure may be reversed by changing the second conductivity type regions 114 to first conductivity type regions 112, and vice-versa. The present specification encompasses all such embodiments.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor device, comprising:

a semiconductor body comprising an upper surface;

an input pad, an output pad, and a reference potential pad, each being disposed on the upper surface;

a first diode region comprising a first p-n junction device that is connected in series between the input pad and the reference potential pad;

a second diode region that is laterally spaced apart from the first diode region and comprises a second p-n junction device that is connected in series between the output pad and the reference potential pad; and a resistor region that is laterally between the first diode region and the second diode region and comprises a resistor that is connected in series between the input pad and the output pad, wherein the first p-n junction device comprises first and second p-n junction diodes that are arranged in an antiseries configuration, wherein the second p-n junction device comprises third and fourth p-n junction diodes that are arranged in an antiseries configuration, wherein the first and second diode regions each comprise a plurality of elongated n-type regions and a plurality of elongated p-type regions, and wherein the elongated n-type regions are interdigitated with the p-type regions, and wherein the first and second p-n junction diodes are formed by groups of NPN structures or PNP structures from the first diode region that are connected in parallel with one another, and wherein the third and fourth p-n junction diodes are formed by groups of NPN structures or PNP structures from the second diode region that are connected in parallel with one another.

2. The semiconductor device of claim 1, wherein the resistor region comprises a doped diffusion well that extends to the upper surface and is electrically isolated from a surrounding substrate region of the semiconductor body.

3. The semiconductor device of claim 1, wherein the groups of NPN structures or PNP structures from the first diode region and the groups of NPN structures or PNP structures from the second diode region are electrically contacted by conductive runners formed in a lower interconnect layer of the semiconductor device.

4. The semiconductor device of claim 1, wherein the input pad, the output pad, and the reference potential pad are formed in an upper metallization layer of the semiconductor device, wherein the upper metallization layer is separated from the upper surface of the semiconductor body by one or more dielectric layers.

5. The semiconductor device of claim 1, wherein elongated n-type regions and the elongated p-type regions of the first diode region are symmetrically arranged with the n-type regions and the elongated p-type regions of the first diode region about an axis of symmetry that is laterally between the first and second diode regions.

* * * * *